US 9,028,620 B2

United States Patent
Archer (10) Patent No.: US 9,028,620 B2
(45) Date of Patent: May 12, 2015

(54) SUBSTRATE CLEAN SOLUTION FOR COPPER CONTAMINATION REMOVAL

(75) Inventor: Melissa Archer, San Jose, CA (US)

(73) Assignee: AWBSCQEMGK, Inc., Sunnyvale, CA (US)

(*) Notice: Subject to any disclaimer, the term of this patent is extended or adjusted under 35 U.S.C. 154(b) by 0 days.

(21) Appl. No.: 13/042,379

(22) Filed: Mar. 7, 2011

(65) Prior Publication Data

US 2011/0214697 A1 Sep. 8, 2011

Related U.S. Application Data

(60) Provisional application No. 61/311,226, filed on Mar. 5, 2010.

(51) Int. Cl.
*H01L 21/02* (2006.01)
*H01L 21/78* (2006.01)

(52) U.S. Cl.
CPC .... *H01L 21/02041* (2013.01); *H01L 21/02054* (2013.01); *H01L 21/02052* (2013.01); *H01L 21/7813* (2013.01)

(58) Field of Classification Search
USPC ........... 134/28, 42, 26, 29, 41; 216/40, 41, 83
See application file for complete search history.

(56) References Cited

U.S. PATENT DOCUMENTS

| 4,313,266 | A | * | 2/1982 | Tam | 34/317 |
| 6,593,282 | B1 | * | 7/2003 | Li et al. | 510/175 |
| RE42,128 | E | * | 2/2011 | Egbe | 430/392 |
| 8,129,287 | B2 | * | 3/2012 | Suzuki et al. | 438/745 |
| 2008/0269096 | A1 | * | 10/2008 | Visintin et al. | 510/176 |
| 2009/0278233 | A1 | * | 11/2009 | Pinnington et al. | 257/615 |
| 2010/0116784 | A1 | * | 5/2010 | Archer | 216/40 |

FOREIGN PATENT DOCUMENTS

| EP | 1950326 A1 | 7/2008 |
| JP | 2003023004 A | 1/2003 |

OTHER PUBLICATIONS

Van Geelen et al. "Epitaxial lift-off GaAs cell from a reusable GaAs substrate". Material Science and Engineering B45. 1997: 162-171.*
Song, et al. "Wet Chemical Cleaning Process of GaAs Substrate for Ready-to-Use", Journal of Crystal Growth, Elsevier, Amsterdam, NL vol. 264, No. 1-3 dated Mar. 15, 2004.

* cited by examiner

*Primary Examiner* — Eric Golightly
*Assistant Examiner* — Arlyn I Rivera-Cordero (57) ABSTRACT

Embodiments of the invention generally relate to a method for selectively etching or otherwise removing copper or other metallic contaminants from a substrate, such as a gallium arsenide wafer. In one embodiment, a method for selectively removing metallic contaminants from a substrate surface is provided which includes exposing a substrate to a peroxide clean solution, exposing the substrate to a hydroxide clean solution, and exposing the substrate to a selective etch solution containing potassium iodide, iodine, sulfuric acid, and water during a selective etch process. The substrate generally contains gallium arsenide material, such as crystalline gallium arsenide, and is usually a growth substrate for an epitaxial lift off (ELO) process. The copper or other metallic contaminants disposed on the substrate may be selectively etched at a rate of about 500 times, about 1,000 times, about 2,000 times, or about 4,000 times or greater than the gallium arsenide material.

20 Claims, 2 Drawing Sheets

SUBSTRATE CLEAN SOLUTION FOR COPPER CONTAMINATION REMOVAL

RELATED CASES

This application claims benefit to provisional application No. 61/311,226 entitled "Substrate Clean Solution for Copper Contamination Removal" filed Mar. 5, 2010, which is incorporated herein by reference in its entirety.

FIELD OF INVENTION

Embodiments of the invention generally relate to methods for fabricating photovoltaic, semiconductor, and electronic devices, and more particularly to methods for removing metallic contaminates from substrates which are used during epitaxial lift off (ELO) processes.

BACKGROUND

Photovoltaic or solar devices, semiconductor devices, or other electronic devices are usually manufactured by utilizing a variety of fabrication processes to manipulate the surface of a substrate. Epitaxial lift off (ELO) is a less common technique for fabricating thin film devices. The ELO process provides growing an epitaxial film, layer, or material on a sacrificial layer which is disposed on a growth substrate, such as a gallium arsenide wafer. Subsequently, the sacrificial layer is selectively etched away in an acid bath, while the epitaxial material is separated from the growth substrate. The isolated epitaxial material is a thin layer or film and is usually referred to as the ELO film or the epitaxial film. Each ELO film generally contains numerous layers of varying compositions relative to the specific device, such as a photovoltaic or solar cell, a laser diode, or other electronic devices.

The growth substrates are usually crystalline wafers of gallium arsenide or other Group III/V elements. The growth substrates are very expensive, so much so as to be commercially cost prohibiting if incorporated into the finished ELO film or device. Therefore, once the ELO film has been removed during the ELO process, the growth substrates are cleaned, treated, and reused to manufacture additional ELO films.

Subsequent to the ELO process, the growth substrate usually has metallic and non-metallic contaminants adhered or otherwise deposited thereon. The growth substrate may contain metallic contaminants, such as copper contaminants at unacceptable levels, such as greater than $1 \times 10^{15}$ metal atoms/$cm^2$. The metallic contaminants, especially copper, if not removed from the substrate, will further contaminate ELO films which will later be formed on the growth substrate. Also, the CVD chamber and other equipment could be contaminated by the metallic contaminants and later be exposed to additional ELO films. The copper and other metallic contaminants are detrimental to the ELO films and devices which usually contain gallium arsenide materials.

Therefore, there is a need for alternative substrate cleaning methods in order to reduce or remove copper and other metallic contaminates from substrate surfaces.

SUMMARY OF THE INVENTION

Embodiments of the invention generally relate to a method for selectively etching or otherwise removing metallic contaminants, such as copper deposits, from a substrate, wafer, or epitaxial film of a Group III/V compound, such as a gallium arsenide. In one embodiment, a method for selectively removing metallic contaminants from a substrate surface is provided which includes exposing a substrate to a peroxide clean solution, exposing the substrate to a hydroxide clean solution, and exposing the substrate to a selective etch solution containing potassium iodide, iodine, sulfuric acid, and water during a selective etch process. The substrate generally contains gallium arsenide material, such as crystalline gallium arsenide, and is usually a growth substrate for an epitaxial lift off (ELO) process. The metallic contaminants disposed on the substrate often contain copper or copper alloys and may be selectively etched at a rate of about 100 times or greater than the gallium arsenide material.

In another embodiment of the invention, a method for selectively removing copper or other metallic contaminants from a substrate surface is provided which includes exposing a substrate to an ELO etch solution during an epitaxial lift off process, wherein the ELO etch solution contains a complexing inhibitor compound, rinsing the substrate to remove residues of the ELO etch solution, exposing the substrate to a first clean solution containing hydrogen peroxide, rinsing the substrate to remove residues of the first clean solution, exposing the substrate to a second clean solution containing ammonium hydroxide, rinsing the substrate to remove residues of the second clean solution, and exposing the substrate to a selective etch solution containing potassium iodide, iodine, sulfuric acid, and water during a selective etch process, wherein the copper or other metallic contaminants are selectively etched at a rate of about 100 times or greater than the gallium arsenide material.

BRIEF DESCRIPTION OF THE DRAWINGS

So that the manner in which the above recited features of the invention can be understood in detail, a more particular description of the invention, briefly Summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally relate to a method for selectively etching or otherwise removing metallic contaminants, such as copper deposits, from a substrate, wafer, or epitaxial film/material of a Group III/V compound, such as a gallium arsenide or gallium arsenide alloys. In one embodiment, a method for selectively removing metallic contaminants from a substrate surface is provided which includes exposing a substrate to a peroxide clean solution, exposing the substrate to a hydroxide clean solution, and exposing the substrate to a selective etch solution containing potassium iodide, iodine, sulfuric acid, and water during a selective etch process. In many embodiments, the selective etch solution has a Cu/GaAs selectivity of about 500 or greater, about 1,000 or greater, about 2,000 or greater, or about 4,000 or greater. Therefore, the copper contaminant may be selectively etched at a rate of about 500 times or greater, about 1,000 times or greater, about 2,000 times or greater, or about 4,000 times or greater than the gallium arsenide material.

In another embodiment of the invention, a method for selectively removing metallic contaminants from a substrate surface subsequent an epitaxial lift off (ELO) process is provided which includes exposing a substrate to a first clean solution containing hydrogen peroxide, rinsing the substrate to remove residues of the first clean solution, exposing the substrate to a second clean solution containing ammonium hydroxide, rinsing the substrate to remove residues of the second clean solution, and exposing the substrate to a selective etch solution during a selective etch process.

After a traditional ELO process as known in the art, the growth substrate may contain metallic contaminants, such as copper contaminants at unacceptable levels, such as greater than $1 \times 10^{15}$ metal atoms/cm$^2$. The processes described by embodiments herein may be utilized to reduce the copper contaminants and other metallic contaminants to a concentration of less than $1 \times 10^{15}$ metal atoms/cm$^2$, preferably, to about $1 \times 10^{14}$ metal atoms/cm$^2$ or less, more preferably, to less than $5 \times 10^{13}$ metal atoms/cm$^2$, more preferably to less than $1 \times 10^{13}$ metal atoms/cm$^2$, more preferably to less than $5 \times 10^{12}$ metal atoms/cm$^2$, more preferably to less than $1 \times 10^{12}$ metal atoms/cm$^2$, more preferably to less than $5 \times 10^{11}$ metal atoms/cm$^2$, more preferably to less than $1 \times 10^{11}$ metal atoms/cm$^2$, more preferably to less than $5 \times 10^{10}$ metal atoms/cm$^2$, more preferably to about $3 \times 10^{10}$ metal atoms/cm$^2$ or less. In some embodiments, the methods may be utilized to reduce the metallic contaminants to a concentration within a range from about $0.5 \times 10^{10}$ metal atoms/cm$^2$ to about $3 \times 10^{10}$ metal atoms/cm$^2$, or preferably, at a lower concentration.

Figure 1:
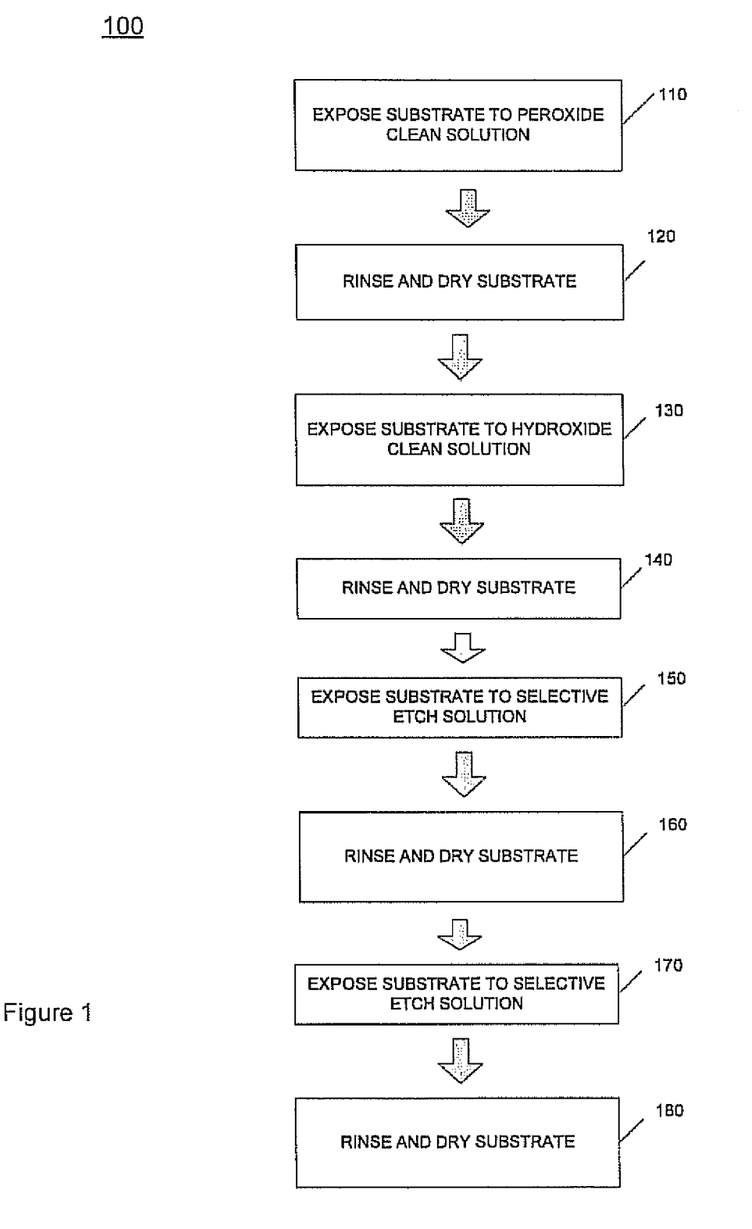
FIG. 1 is a flow chart depicting a substrate cleaning process according to embodiments described herein.

FIG. 1 shows a flow chart depicting process 100 used to remove copper contaminants and/or other metallic contaminants from a substrate, wafer, thin film, or other material, as described by embodiments herein. In many examples, the substrate is a growth substrate that was used to grow an epitaxial film or material during a vapor deposition process and subsequently, the epitaxial film or material was removed from the growth substrate during an ELO process.

In many embodiments, the substrate contains a Group III/V compound or material such as a gallium arsenide material. The gallium arsenide material may be a gallium arsenide wafer, a gallium arsenide alloy wafer, a crystalline film or layer of gallium arsenide or gallium arsenide alloys, as well as other forms of crystalline or epitaxial gallium arsenide or alloys thereof. The metallic contaminants disposed on the substrate often contain copper or copper alloys, but may also include nickel, silver, gold, palladium, platinum, alloys thereof, or combinations thereof.

In some of examples, the hydrogen peroxide used to form the peroxide clean solutions may contain a total hydrogen peroxide concentration by volume within a range from about 30% to about 32%, and in other examples, a total hydrogen peroxide concentration by volume of about 98%.

The substrate is exposed to a peroxide clean solution during step 110 of process 100. The substrate may be exposed to the peroxide clean solution by various techniques. The substrate may be placed into a reservoir (e.g., vat, tub, bath, or other container) containing the peroxide clean solution. Alternatively, the peroxide clean solution may be sprayed or flowed on to the substrate. The substrate may be exposed to the peroxide clean solution for a time period within a range from about 5 seconds to about 120 seconds, preferably, from about 10 seconds to about 60 seconds, and more preferably, from about 20 seconds to about 40 seconds, for example, about 30 seconds. In some embodiments, the peroxide clean solution contains at least one oxidizing agent such as hydrogen peroxide, organic peroxides, inorganic peroxides (e.g., calcium peroxide), derivatives thereof, or combinations thereof. In many examples, the peroxide clean solution contains hydrogen peroxide. The peroxide clean solution may contain hydrogen peroxide or other oxidizing agent at a volumetric concentration within a range from about 20% to about 80%, preferably, from about 30% to about 50%, and more preferably, from about 40% to about 60%, such as about 50%.

The peroxide clean solution is an aqueous solution therefore contains water, such as deionized water. In some examples, the remainder of the peroxide clean solution contains water—that is—the peroxide clean solution only contains the oxidizing agent (e.g., hydrogen peroxide) and water. In other examples, the peroxide clean solution may contain at least one additive such as chelating agents or chelators, surfactants, stabilizers, salts, buffers, acids, bases, or combinations thereof. In many examples, the substrate may be exposed to a peroxide clean solution containing hydrogen peroxide at a volumetric concentration within a range from about 40% to about 60%, such as about 50%. In one example, the peroxide clean solution contains by volume about 50% of hydrogen peroxide and about 50% of water.

In step 120 of process 100, the substrate may be exposed to a rinse step followed by a drying step subsequent to being exposed to the peroxide clean solution. The method includes ceasing the exposure of the peroxide clean solution to the substrate, such as removing the substrate from the peroxide clean solution, ceasing the spraying, dripping, or other exposure of the peroxide clean solution on to the substrate. Thereafter, the substrate may be rinsed to remove residues of the peroxide clean solution or other contaminants disposed thereon.

The rinsing step may be done by placing the substrate into a reservoir (e.g., vat, tub, bath, or other container) containing the rinse solution, such as deionized water. Alternatively, the rinse solution may be sprayed or flowed on to the substrate. The substrate may be exposed to the rinse solution for a time period within a range from about 5 seconds to about 120 seconds, preferably, from about 10 seconds to about 60 seconds, and more preferably, from about 20 seconds to about 40 seconds, for example, about 30 seconds.

In most embodiments, the rinse solution generally contains only water, such as deionized water.

Once the substrate has been rinsed by the rinse solution, the substrate may be exposed to a drying step, also in step 120 of process 100. During the drying step, the substrate is exposed to a drying gas, such as nitrogen (N2), argon, helium, neon, ambient air, dried air, hydrogen, or combinations thereof.

The substrate is exposed to a hydroxide clean solution during step 130 of process 100. The substrate may be exposed to the hydroxide clean solution by various techniques. The substrate may be placed into a reservoir (e.g., vat, tub, bath, or other container) containing the hydroxide clean solution. Alternatively, the hydroxide clean solution may be sprayed or flowed on to the substrate. The substrate may be exposed to the hydroxide clean solution for a time period within a range from about 5 seconds to about 120 seconds, preferably, from about 10 seconds to about 60 seconds, and more preferably, from about 20 seconds to about 40 seconds, for example, about 30 seconds.

The hydroxide clean solution contains at least one hydroxide compound such as ammonium hydroxide, alkylammonium hydroxides (e.g., tetramethylammonium hydroxide), inorganic hydroxides (e.g., Na, K, Li, or Ca), derivatives thereof, or combinations thereof. The alkylammonium hydroxides include tetramethylammonium hydroxide (TMAH), trimethylammonium hydroxide, dimethylammonium hydroxide, tetraethylammonium hydroxide (TEAH), derivatives thereof, or combinations thereof. In many examples, the hydroxide clean solution contains ammonium hydroxide. The hydroxide clean solution may contain ammonium hydroxide or other hydroxide compound at a volumetric concentration within a range from about 20% to about 80%, preferably, from about 30% to about 50%, and more preferably, from about 40% to about 60%, such as about 50%.

In some of examples, the ammonium hydroxide used to form the hydroxide clean solutions may contain a total ammonium hydroxide concentration by volume within a range from about 28% to about 30%.

In step 140 of process 100, the substrate may be exposed to a rinse step followed by a drying step subsequent to being exposed to the hydroxide clean solution. The method includes ceasing the exposure of the hydroxide clean solution to the substrate, such as removing the substrate from the hydroxide clean solution, ceasing the spraying, dripping, or other exposure of the peroxide clean solution on to the substrate. Thereafter, the substrate may be rinsed to remove residues of the hydroxide clean solution or other contaminants disposed thereon.

The rinsing step may be done by placing the substrate into a reservoir (e.g., vat, tub, bath, or other container) containing the rinse solution, such as deionized water. Alternatively, the rinse solution may be sprayed or flowed on to the substrate. The substrate may be exposed to the rinse solution for a time period within a range from about 5 seconds to about 120 seconds, preferably, from about 10 seconds to about 60 seconds, and more preferably, from about 20 seconds to about 40 seconds, for example, about 30 seconds. In most embodiments, the rinse solution generally contains only water, such as deionized water.

Once the substrate has been rinsed by the rinse solution, the substrate may be exposed to a drying step, also in step 140 of process 100. During the drying step, the substrate is exposed to a drying gas, such as nitrogen (N2), argon, helium, neon, ambient air, dried air, hydrogen, or combinations thereof. Generally, the substrate is exposed to gaseous flow of the drying gas. In many examples, the substrate is exposed to a flow of nitrogen gas during the drying step. The substrate may be exposed to the drying gas until adequately dried, or for a time period within a range from about 5 seconds to about 120 seconds, preferably, from about 10 seconds to about 60 seconds, and more preferably, from about 20 seconds to about 40 seconds, for example, about 30 seconds.

The substrate is exposed to a selective etch solution during a selective etch process at step 150 of process 100. A metallic contaminant, such as a copper contaminant, may be selectively etched at a rate of about 100 times or greater, about 200 times or greater, about 500 times or greater, about 1,000 times or greater, about 2,000 times or greater, or about 4,000 times or greater than the gallium arsenide material contained within the substrate. Therefore, the metallic and copper contaminants are selectively etched or removed from the substrate while gallium arsenide is not significantly etched or removed from within the substrate. In some embodiments, the selective etch solution was prepared to maximize the etch rate of metallic contaminates while minimizing the hazing of the substrate surfaces, such as copper contaminants and substrates containing gallium arsenide materials.

The selective etch solution contains potassium iodide (KI), iodine ($I_2$), sulfuric acid ($H_2SO_4$), water, derivatives thereof, intermediates thereof, ions thereof, or reaction products thereof. Some of the derivatives, intermediates, ions, or reaction products which may be formed and may be present in the selective etch solution include iodine ions (r), triiodine ions ($I_3^-$), protons ($H^+$), potassium cations ($K^+$), hydrogen sulfate ions ($HSO_4^-$), sulfate ions ($SO_4^{2-}$), and others. The substrate may be exposed to the selective etch solution by various techniques, such as being placed into a reservoir (e.g., vat, tub, bath, or other container) containing the selective etch solution. Alternatively, the selective etch solution may be sprayed or flowed on to the substrate. The substrate may be exposed to the selective etch solution for a time period within a range from about 1 second to about 60 seconds, preferably, from about 3 seconds to about 30 seconds, and more preferably, from about 5 seconds to about 20 seconds, for example, about 10 seconds. The selective etch solution may be at a temperature within a range from about −10° C. to about 10° C., for example, from about 0° C. to about 5° C. during the selective etch process at step 150.

In many of the embodiments described herein, a substrate containing gallium arsenide or a gallium arsenide alloy may be exposed to the selective etch solution and selectively etched at a rate of about 100 times or greater than the gallium arsenide material contained within the substrate. The selective etch solution has a copper to gallium arsenide selectivity (Cu/GaAs selectivity) of about 100 or greater, about 200 or greater, about 300 or greater, about 500 or greater, about 1,000 or greater, about 2,000 or greater, or about 4,000 or greater.

In some examples, the selective etch solution removes the gallium arsenide material at an etch rate of about 0.0005 um/min or slower while only removing the copper contaminants at an etch rate of about 2 um/min or faster. Therefore, the selective etch solution Cu/GaAs selectivity greater than 4,000.

In one embodiment, the selective etch solution may be formed by combining equal volumes of an iodine solution and a sulfuric acid solution. The iodine solution contains potassium iodide, iodine, water, derivatives thereof, and reaction products thereof. The selective etch solution may have a pH value within a range from about −0.5 to about 2.5, preferably, from about 0 to about 2.0, and more preferably, from about 0.5 to about 1.5.

The iodine solution contains at least a mixture of potassium iodide, iodine, water, derivatives thereof, intermediates thereof, ions thereof, or reaction products thereof. Some of the derivatives, intermediates, ions, or reaction products which may be formed and may be present in the iodine solution include iodine ions ($I^-$), triiodine ions ($1^{3-}$), protons ($H^+$), and others. The iodine solution may be formed by combining, by weight, potassium iodide within a range from about 30% to about 50%, for example, from about 38% to about 42%, iodine within a range from about 20% to about 30%, for example, from about 22% to about 26%, and water within a range from about 30% to about 50%, for example, from about 34% to about 38%.

The sulfuric acid solution contains at least a mixture of sulfuric acid and water. Generally, the sulfuric acid is concentrated sulfuric acid (e.g., about 97%-98%) and the water is deionized water. The sulfuric acid solution may have a pH value within a range from about 0.5 to about 1.5.

The sulfuric acid solution and the iodine solution may independently be at a predetermined temperature while being combined together to form the selective etch solution. The iodine solution may be at a temperature within a range from about −10° C. to about 10° C., such as from about 0° C. to about 50° C. Similarly, the sulfuric acid solution may be at a temperature within a range from about −10° C. to about 10° C., such as from about 0° C. to about 5° C.

In one specific example, a selective etch solution was prepared by combining equal volumetric amounts of an iodine solution and a sulfuric acid solution. The selective etch solution had a pH value within a range from about 0.5 to about 1.5. The iodine solution was prepared by combining about 111 g of potassium iodine (KI), about 65 g of iodine ($I_2$), and about 100 mL of deionized water. The sulfuric acid solution was prepared by adding about 3 mL of concentrated sulfuric acid ($H_2SO_4$) with about 250 mL of deionized water. The sulfuric acid solution had a pH value of about 0.9.

In step 160 of process 100, the substrate may be exposed to a rinse step followed by a drying step subsequent to being exposed to the selective etch solution. The method includes ceasing the exposure of the selective etch solution to the substrate, such as removing the substrate from the selective etch solution, ceasing the spraying, dripping, or other exposure of the peroxide clean solution on to the substrate. Thereafter, the substrate may be rinsed to remove residues of the selective etch solution or other contaminants disposed thereon.

Once the substrate has been rinsed by the rinse solution, the substrate may be exposed to a drying step, also in step 160 of process 100. During the drying step, the substrate is exposed to a drying gas, such as nitrogen (N2), argon, helium, neon, ambient air, dried air, hydrogen, or combinations thereof. Generally, the substrate is exposed to gaseous flow of the drying gas. In many examples, the substrate is exposed to a flow of nitrogen gas during the drying step. The substrate may be exposed to the drying gas until adequately dried, or for a time period within a range from about 5 seconds to about 120 seconds, preferably, from about 10 seconds to about 60 seconds, and more preferably, from about 20 seconds to about 40 seconds, for example, about 30 seconds.

The substrate is exposed to a second selective etch solution during a second selective etch process at step 170 of process 100. In one embodiment, the selective etch solution utilized in step 170 is the same selective etch solution or has the same composition as the selective etch solution utilized in step 150. In another embodiment, the selective etch solution utilized in step 170 is a different selective etch solution or has a different composition as the selective etch solution utilized in step 150.

A metallic contaminant, such as a copper contaminant, may be selectively etched at a rate of about 100 times or greater, about 200 times or greater, about 500 times or greater, about 1,000 times or greater, about 2,000 times or greater, or about 4,000 times or greater than the gallium arsenide material contained within the substrate. Therefore, the metallic and copper contaminants are selectively etched or removed from the substrate while gallium arsenide is not significantly etched or removed from within the substrate. In some embodiments, the selective etch solution was prepared to maximize the etch rate of metallic contaminates while minimizing the hazing of the substrate surfaces, such as copper contaminants and substrates containing gallium arsenide materials.

The selective etch solution contains potassium iodide (KI), iodine ($I_2$), sulfuric acid ($H_2SO_4$), water, derivatives thereof, or reaction products thereof. The substrate may be exposed to the selective etch solution by various techniques, such as being placed into a reservoir (e.g., vat, tub, bath, or other container) containing the selective etch solution. Alternatively, the selective etch solution may be sprayed or flowed on to the substrate. The substrate may be exposed to the selective etch solution for a time period within a range from about 1 second to about 60 seconds, preferably, from about 3 seconds to about 30 seconds, and more preferably, from about 5 seconds to about 20 seconds, for example, about 10 seconds. The selective etch solution may be at a temperature within a range for example, from about 0 degrees celsius to about 5 degrees celsius during the selective etch process at step 170.

In many of the embodiments described herein, a substrate containing gallium arsenide or a gallium arsenide alloy may be exposed to the selective etch solution and selectively etched at a rate of about 100 times or greater than the gallium arsenide material contained within the substrate. The selective etch solution has a copper to gallium arsenide selectivity (Cu/GaAs selectivity) of about 100 or greater, about 200 or greater, about 300 or greater, about 500 or greater, about 1,000 or greater, about 2,000 or greater, or about 4,000 or greater.

In one embodiment, the selective etch solution may be formed by combining equal volumes of an iodine solution and a sulfuric acid solution, as described in step 150. The iodine solution contains potassium iodide, iodine, water, derivatives thereof, and reaction products thereof. The selective etch solution may have a pH value within a range from about −0.5 to about 2.5, preferably, from about 0 to about 2.0, and more preferably, from about 0.5 to about 1.5.

In step 180 of process 100, the substrate may be exposed to a rinse step followed by a drying step subsequent to being exposed to the selective etch solution. The method includes ceasing the exposure of the selective etch solution to the substrate, such as removing the substrate from the selective etch solution, ceasing the spraying, dripping, or other exposure of the peroxide clean solution on to the substrate. Thereafter, the substrate may be rinsed to remove residues of the selective etch solution or other contaminants disposed thereon.

Once the substrate has been rinsed by the rinse solution, the substrate may be exposed to a drying step, also in step 180 of process 100. During the drying step, the substrate is exposed to a drying gas, such as nitrogen ($N_2$), argon, helium, neon, ambient air, dried air, hydrogen, or combinations thereof. Generally, the substrate is exposed to gaseous flow of the drying gas. In many examples, the substrate is exposed to a flow of nitrogen gas during the drying step. The substrate may be exposed to the drying gas until adequately dried, or for a time period within a range from about 5 seconds to about 120 seconds, preferably, from about 10 seconds to about 60 seconds, and more preferably, from about 20 seconds to about 40 seconds, for example, about 30 seconds.

In some embodiments, process 100 includes completing the selective etch on the substrate (step 150), removing the substrate from the selective etch solution, rinsing the substrate to remove residues of the selective etch solution or other contaminants disposed thereon, as well as drying the substrate (step 160), exposing the substrate to the selective etch solution at least a second time (step 170), and then removing the substrate from the selective etch solution, rinsing the substrate, and drying the substrate (step 180). In other embodiments, if the metallic contaminant has been reduced to an acceptable level (e.g., $<1\times10^{13}$ Cu atoms/cm$^2$ or $<1\times10^{12}$ Cu atoms/cm$^2$ or $<1\times10^{11}$ Cu atoms/cm$^2$), process 100 may be completed after step 160 and steps 170 and 180 may be omitted from process 100. Alternatively, in another embodiment, if the metallic contaminant has not been reduced to an acceptable level after the completion of step 180, then steps 170 and 180 may be repeated once, twice, or until the metallic contaminant has been reduced to an acceptable level.

In some examples, the substrate is placed into a reservoir or bath containing the rinse solution (e.g., deionized water) during steps 120 and 140 and the substrate is spray rinsed by a stream of the rinse solution (e.g., deionized water) during steps 160 and 180. In other examples, the substrate is spray rinsed by a 21 stream of the rinse solution (e.g., deionized water) during steps 120, 140, 160, and 180. In other examples, the substrate is placed into a reservoir or bath containing the rinse solution (e.g., deionized water) during steps 120, 140, 160, and 180.

In another embodiment of the invention, a method for selectively removing copper or other metallic contaminants from a substrate surface is provided which includes exposing a substrate to an ELO etch solution during an ELO process, wherein the ELO etch solution contains a complexing inhibitor compound (e.g., BTA), rinsing the substrate to remove residues of the ELO etch solution, exposing the substrate to a first clean solution containing hydrogen peroxide, rinsing the substrate to remove residues of the first clean solution, exposing the substrate to a second clean solution containing ammonium hydroxide, rinsing the substrate to remove residues of the second clean solution, and exposing the substrate to a selective etch solution containing potassium iodide, iodine, sulfuric acid, and water during a selective etch process, wherein the copper or other metallic contaminants are selectively etched at a rate of about 100 times or greater than the gallium arsenide material.

In another embodiment of the invention, a method for selectively removing metallic contaminants from a substrate surface includes exposing a substrate containing an epitaxial film disposed thereon to an ELO etch solution containing a complexing inhibitor compound, etching a sacrificial layer disposed between the substrate and the epitaxial film while peeling the epitaxial film from the substrate, forming the copper contaminant on the substrate, and separating the epitaxial film from the substrate containing the copper contaminant during an ELO process. The method further includes rinsing the substrate to remove residues of the ELO etch solution, exposing the substrate to a peroxide clean solution containing hydrogen peroxide, exposing the substrate to a hydroxide clean solution, and exposing the substrate to a selective etch solution containing potassium iodide, iodine, sulfuric acid, and water during a selective etch process.

Figure 2:
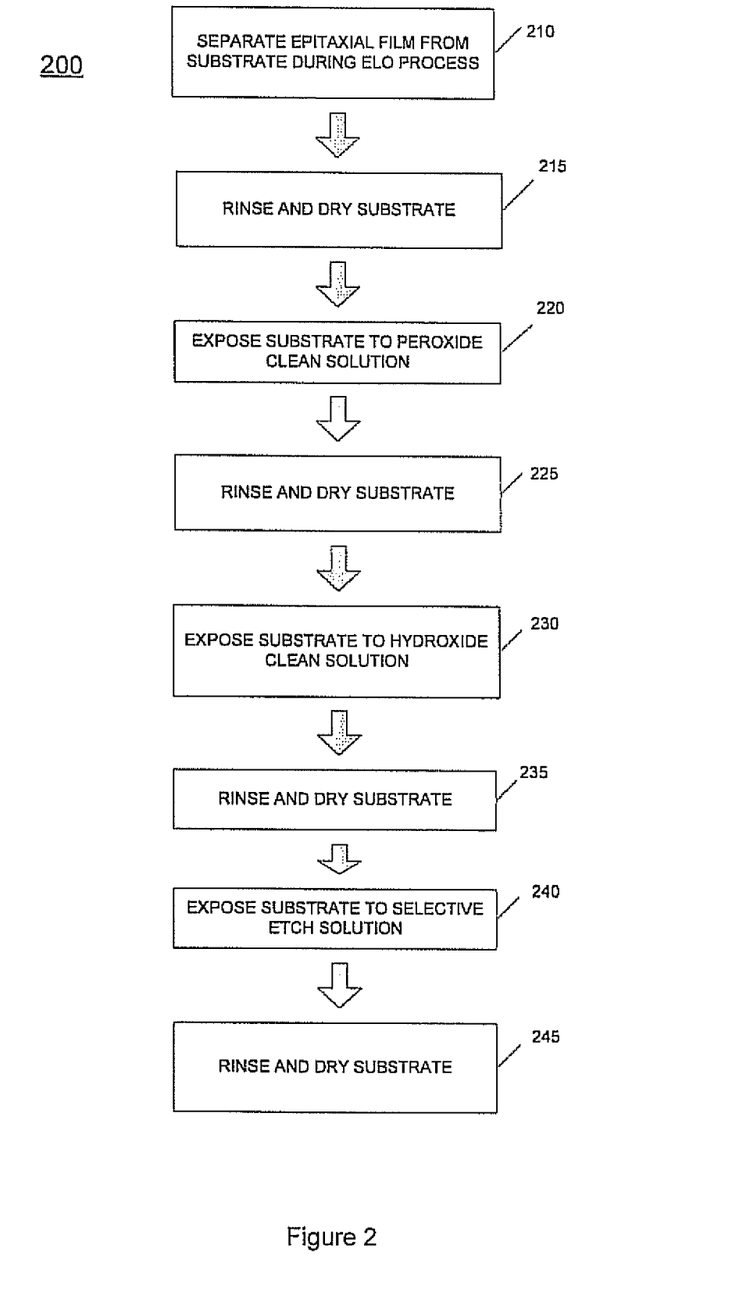
FIG. 2 is a flow chart depicting a process for reducing metallic or copper contaminants on a substrate during ELO and cleaning processes according to embodiments described herein.

FIG. 2 is a flow chart depicting process 200 which is used to reduce metallic or copper contaminants disposed on the surface of a substrate during an ELO process and a Post substrate cleaning process, as described by embodiments herein. In step 210 of process 200, an epitaxial film is separated from a growth substrate during an ELO process. The epitaxial film may be a single layer of material, but is often many layers of varying compositions. The epitaxial film usually contains Group III/V compounds or materials which have been epitaxial grown on the growth substrate.

The substrate is exposed to an ELO etch solution during an ELO process prior to exposing the substrate to the peroxide bath. The substrate usually has a sacrificial layer is disposed between the substrate and the epitaxial film. The ELO process includes exposing the substrate to the ELO etch solution, etching the sacrificial layer while peeling the epitaxial film from the substrate, forming the copper contaminant on the substrate, and separating the epitaxial film from the substrate containing the copper contaminant.

In another embodiment, the ELO etch solution may further contain a complexing inhibitor compound during the ELO process at step 210. The complexing inhibitor compound contained in the ELO etch solution reduces the copper contaminant level, as well as other metallic contaminant levels on the substrate during the ELO process when compared to using an ELO etch solution without the complexing inhibitor compound. Subsequent to step 210, at step 215, the substrate is exposed to a rinse step followed by a drying step to remove residues of the ELO etch solution.

The substrate is exposed to a peroxide clean solution during step 220 of process 200, similar to the peroxide clean solution used in step 110 of process 100. The substrate may be exposed to the peroxide clean solution by various techniques. The substrate may be placed into a reservoir (e.g., vat, tub, bath, or other container) containing the peroxide clean solution. Alternatively, the peroxide clean solution may be sprayed or flowed on to the substrate. The substrate may be exposed to the peroxide clean solution for a time period within a range from about 5 seconds to about 120 seconds, preferably, from about 10 seconds to about 60 seconds, and more preferably, from about 20 seconds to about 40 seconds, for example, about 30 seconds. In some embodiments, the peroxide clean solution contains at least one oxidizing agent such as hydrogen peroxide, organic peroxides, inorganic peroxides (e.g., calcium peroxide), derivatives thereof, or combinations thereof. In many examples, the peroxide clean solution contains hydrogen peroxide. The peroxide clean solution may contain hydrogen peroxide or other oxidizing agent at a volumetric concentration within a range from about 20% to about 80%, preferably, from about 30% to about 50%, and more preferably, from about 40% to about 60%, such as about 50%. Subsequent to step 220, at step 225, the substrate is exposed to a rinse step followed by a drying step to remove residues of the peroxide clean solution.

The substrate is exposed to a hydroxide clean solution during step 230 of process 200, similar to the hydroxide clean solution used in step 130 of process 100. The substrate may be exposed to the hydroxide clean solution by various techniques. The substrate may be placed into a reservoir (e.g., vat, tub, bath, or other container) containing the hydroxide clean solution. Alternatively, the hydroxide clean solution may be sprayed or flowed on to the substrate. The substrate may be exposed to the hydroxide clean solution for a time period within a range from about 5 seconds to about 120 seconds, preferably, from about 10 seconds to about 60 seconds, and more preferably, from about 20 seconds to about 40 seconds, for example, about 30 seconds. Subsequent to step 230, at step 235, the substrate is exposed to a rinse step followed by a drying step to remove residues of the hydroxide clean solution.

The substrate is exposed to a selective etch solution during a selective etch process at step 240 of process 200, similar to the selective etch solution and process used in step 150 of process 100. A metallic contaminant, such as a copper contaminant, may be selectively etched at a rate of about 100 times or greater, about 200 times or greater, about 500 times or greater, about 1,000 times or greater, about 2,000 times or greater, or about 4,000 times or greater than the gallium arsenide material contained within the substrate. Therefore, the metallic and copper contaminants are selectively etched or removed from the substrate while gallium arsenide is not significantly etched or removed from within the substrate. In some embodiments, the selective etch solution was prepared to maximize the etch rate of 29 metallic contaminates while minimizing the hazing of the substrate surfaces, such as copper contaminants and substrates containing gallium arsenide materials. Subsequent to step 240, at step 245, the substrate is exposed to a rinse step followed by a drying step to remove residues of the selective etch solution.

While the foregoing is directed to embodiments of the invention, other and further embodiments of the invention may be devised without departing from the basic scope thereof, and the scope thereof is determined by the claims that follow.

What is claimed is:

1. A method for selectively removing metallic contaminants from a substrate surface, comprising:
  exposing a substrate to a peroxide clean solution subsequent an epitaxial lift off (ELO) process, wherein the substrate comprises gallium arsenide material, and disposing a copper contaminant on the substrate at a first copper contaminant concentration of at least $1\times10^{15}$ copper atoms/cm$^2$
  exposing the substrate to a hydroxide clean solution; and
  exposing the substrate to a selective etch solution comprising potassium iodide, iodine, sulfuric acid, and water during a selective etch process, wherein the copper contaminant is selectively etched at a rate of about 100 times or greater than the gallium arsenide material and the first copper contaminant concentration is lowered to a second copper contaminant concentration of about $1\times10^{14}$ copper atoms/cm$^2$ or less and wherein the substrate is exposed to a rinse step followed by a drying step using a drying gas comprising at least one of nitrogen (N2), argon, helium, neon, ambient air, dried air and hydrogen subsequent to being exposed to the hydroxide clean solution and prior to being exposed to the selective etch solution.

2. The method of claim 1, wherein the second copper contaminant concentration is about $1\times10^{13}$ copper atoms/cm$^2$ or less.

3. A method for selectively removing metallic contaminants from a substrate surface, comprising:
  exposing a substrate comprising a gallium arsenide material to an ELO etch solution comprising a complexing inhibitor compound during an epitaxial lift off process, wherein a sacrificial layer is disposed on the substrate and an epitaxial film is disposed on the sacrificial layer;
  etching the sacrificial layer while peeling the substrate from the wafer;
  forming the copper contaminant on the substrate; and
  separating the epitaxial film from the substrate containing the copper contaminant;
  rinsing the substrate to remove residues of the ELO etch solution;
  exposing the substrate to a peroxide clean solution after said rinsing the substrate to remove residues of the ELO etch solution;
  rinsing the substrate to remove residues of the peroxide clean solution;
  exposing the substrate to a hydroxide clean solution;
  rinsing the substrate to remove residues of the hydroxide clean solution; and
  exposing the substrate to a selective etch solution comprising potassium iodide, iodine, sulfuric acid, and water during a selective etch process, wherein the copper contaminant is selectively etched at a rate of about 100 times or greater than the gallium arsenide material during the selective etch process and wherein the substrate is exposed to a drying step using a drying gas comprising at least one of nitrogen (N2), argon, helium, neon, ambient air, dried air and hydrogen subsequent to being exposed to the hydroxide clean solution and prior to being exposed to the selective etch solution.

4. The method of claim 3, wherein the peroxide clean solution comprises hydrogen peroxide.

5. The method of claim 3 wherein the copper contaminant concentration is about $1\times10^{15}$ copper atoms/cm$^2$ or less.

6. The method of claim 3, wherein the hydroxide clean solution comprises ammonium hydroxide.

7. The method of claim 3 wherein the rinsing is performed with deionized water.

8. The method of claim 3, wherein said selective etch solution comprises a temperature range between $-10°$ C. to $10°$ C.

9. The method of claim 3, wherein the substrate is exposed to the selective etch solution during a second selective etch process for a time period within a range from about 5 seconds to about 20 seconds.

10. The method of claim 3, wherein the substrate is exposed to the peroxide clean solution for a time period within a range from about 20 seconds to about 40 seconds.

11. A method for selectively removing metallic contaminants from a substrate surface, comprising:
  exposing a substrate to a peroxide clean solution subsequent an epitaxial lift off (ELO) process, wherein the substrate comprises gallium arsenide material and a copper contaminant is disposed on the substrate;
  exposing the substrate to a hydroxide clean solution; and
  exposing the substrate to a selective etch solution comprising potassium iodide, iodine, sulfuric acid, and water during a selective etch process, wherein the copper contaminant is selectively etched at a rate of about 100 times or greater than the gallium arsenide material,
  wherein the substrate is exposed to a rinse step followed by a drying step using a drying gas comprising at least one of nitrogen (N2), argon, helium, neon, ambient air, dried air and hydrogen subsequent to being exposed to the peroxide solution and prior to being exposed to the hydroxide solution, and
  wherein the substrate is exposed to a rinse step followed by a drying step subsequent to being exposed to the hydroxide solution and prior to being exposed to the selective etch solution.

12. The method of claim 11, wherein the substrate is exposed to the peroxide clean solution for a time period within a range from about 20 seconds to about 40 seconds.

13. The method of claim 11, wherein the substrate is exposed to the hydroxide clean solution for a time period within a range from about 20 seconds to about 40 seconds.

14. The method of claim 11, wherein the substrate is exposed to the selective etch solution during the selective etch process for a time period within a range from about 5 seconds to about 20 seconds.

15. The method of claim 11, further comprising exposing the substrate to an ELO etch solution during an ELO process prior to exposing the substrate to the peroxide clean solution.

16. The method of claim 15, wherein the ELO process comprises:
  exposing the substrate containing an epitaxial film disposed thereon to the ELO etch solution, wherein a sacrificial layer is disposed between the substrate and the epitaxial film;
  etching the sacrificial layer while peeling the epitaxial film from the substrate;
  forming the copper contaminant on the substrate; and
  separating the epitaxial film from the substrate containing the copper contaminant.

17. The method of claim 11, further comprising:
  removing the substrate from the selective etch solution;
  rinsing the substrate to remove residues of the selective etch solution or other contaminants disposed thereon;
  drying the substrate using a drying gas; and
  exposing the substrate to the selective etch solution during a second selective etch process.

18. The method of claim 17, wherein the substrate is rinsed with deionized water.

19. The method of claim 17, wherein the substrate is exposed to the selective etch solution during the second selective etch process for a time period within a range from about 5 seconds to about 20 seconds.

20. The method of claim 17, wherein the substrate is exposed to a rinse step with deionized water followed by a drying step subsequent to the second selective etch process.

\* \* \* \* \*

UNITED STATES PATENT AND TRADEMARK OFFICE
CERTIFICATE OF CORRECTION

PATENT NO. : 9,028,620 B2
APPLICATION NO. : 13/042379
DATED : May 12, 2015
INVENTOR(S) : Melissa Archer

Page 1 of 1

It is certified that error appears in the above-identified patent and that said Letters Patent is hereby corrected as shown below:

On the Assignee information on the left column of the Title page, item (73):

please delete "AWBSCQEMGK, Inc., Sunnyvale, CA (US)" and insert --ALTA DEVICES, INC., Sunnyvale, CA (US)--

Signed and Sealed this
Twenty-sixth Day of July, 2016

Michelle K. Lee
*Director of the United States Patent and Trademark Office*